United States Patent
Chang et al.

(10) Patent No.: US 8,715,810 B2
(45) Date of Patent: May 6, 2014

(54) COATED ARTICLE AND METHOD FOR MAKING THE SAME

(75) Inventors: Hsin-Pei Chang, Tu-Cheng (TW);
Wen-Rong Chen, Tu-Cheng (TW);
Huann-Wu Chiang, Tu-Cheng (TW);
Cheng-Shi Chen, Tu-Cheng (TW);
Cong Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 186 days.

(21) Appl. No.: 13/158,570

(22) Filed: Jun. 13, 2011

(65) Prior Publication Data
US 2012/0171416 A1    Jul. 5, 2012

(30) Foreign Application Priority Data
Dec. 29, 2010  (CN) .......................... 2010 1 0612741

(51) Int. Cl.
*C09D 1/00*    (2006.01)

(52) U.S. Cl.
USPC ........ 428/148; 428/142; 428/144; 106/286.2; 106/286.5; 106/286.6

(58) Field of Classification Search
USPC .................................. 428/141–145, 148–149
See application file for complete search history.

(56) References Cited

U.S. PATENT DOCUMENTS

| | | | | |
|---|---|---|---|---|
| 2001/0031365 | A1* | 10/2001 | Anderson et al. | 428/432 |
| 2004/0081818 | A1* | 4/2004 | Baumann et al. | 428/323 |
| 2007/0059490 | A1* | 3/2007 | Kaneko | 428/141 |
| 2012/0141784 | A1* | 6/2012 | Chang et al. | 428/336 |
| 2012/0171474 | A1* | 7/2012 | Chang et al. | 428/336 |

* cited by examiner

*Primary Examiner* — Aaron Austin
*Assistant Examiner* — Megha Mehta
(74) *Attorney, Agent, or Firm* — Novak Druce Connolly Bove + Quigg LLP

(57) ABSTRACT

A coated article is described. The coated article includes a substrate, a magnesium oxide-alumina compound layer formed on the substrate, and an anti-fingerprint layer formed on the magnesium oxide-alumina compound layer. The anti-fingerprint layer is a layer of magnesium-aluminum-oxygen-fluorine having the chemical formula of $MgAlO_xF_y$, wherein $0<x<2.5$, $0<y<5$. A method for making the coated article is also described.

10 Claims, 3 Drawing Sheets

COATED ARTICLE AND METHOD FOR MAKING THE SAME

CROSS-REFERENCE TO RELATED APPLICATIONS

This application is one of the three related co-pending U.S. patent applications listed below. All listed applications have the same assignee. The disclosure of each of the listed applications is incorporated by reference into all the other listed applications.

|  | Title | Inventors |
|---|---|---|
| US 13/158,563 | COATED ARTICLE AND METHOD FOR MAKING THE SAME | HSIN-PEI CHANG et al. |
| US 13/158,569 | COATED ARTICLE AND METHOd FOR MAKING THE SAME | HSIN-PEI CHANG et al. |
| US 13/158,570 | COATED ARTICLE AND METHOD FOR MAKING THE SAME | HSIN-PEI CHANG et al. |

BACKGROUND

1. Technical Field

The present disclosure relates to coated articles, particularly to a coated article having an anti-fingerprint property and a method for making the coated article.

2. Description of Related Art

Many electronic device housings are coated with an anti-fingerprint layer. The anti-fingerprint layer is commonly painted on the housing as a paint containing organic anti-fingerprint substances. However, the printed film is thick (commonly 2 μm-4 μm) and not very effective. Furthermore, the printed film has a poor abrasion resistance, and may look oily. Additionally, the anti-fingerprint layer may contain some residual free formaldehyde, which is neither environmentally nor biologically beneficial.

Therefore, there is room for improvement within the art.

BRIEF DESCRIPTION OF THE FIGURES

Many aspects of the coated article can be better understood with reference to the following figures. The components in the figure are not necessarily drawn to scale, the emphasis instead being placed upon clearly illustrating the principles of the coated article. Moreover, in the drawings like reference numerals designate corresponding parts throughout the several views.

DETAILED DESCRIPTION

Figure 1:
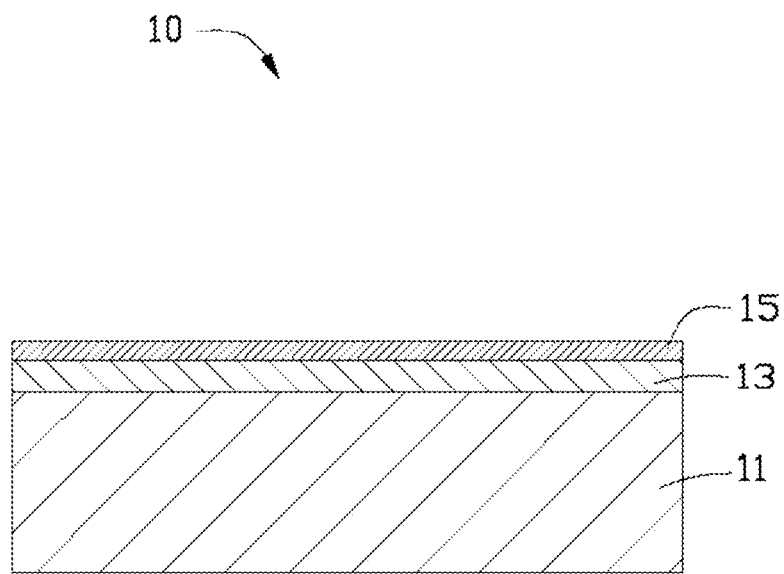
FIG. 1 is a cross-sectional view of an exemplary embodiment of a coated article.

FIG. 1 shows a coated article 10 according to an exemplary embodiment. The coated article 10 includes a substrate 11, and a magnesium oxide-alumina (MgO—$Al_2O_3$) compound layer 13, an anti-fingerprint layer 15 formed in that order on a surface of the substrate 11.

The substrate 11 may be made of metal or non-metal material. The metal may be selected from a group consisting of stainless steel, aluminum, aluminum alloy, copper, copper alloy, and zinc. The non-metal may be ceramic or glass.

The MgO—$Al_2O_3$ compound layer 13 has a non-crystalline structure. The thickness of the MgO—$Al_2O_3$ compound layer 13 may be about 500 nm-600 nm. The MgO—$Al_2O_3$ compound layer 13 may be formed by magnetron sputtering.

The anti-fingerprint layer 15 is a magnesium-aluminum-oxygen-fluorine ($MgAlO_xF_y$) layer. The value of 'x' within the $MgAlO_xF_y$ may be between 0 and 2.5, that is 0<x<2.5. The value of 'y' within the $MgAlO_xF_y$ may be between 0 and 5, that is 0<y<5. The anti-fingerprint layer 15 has a non-crystalline structure. The thickness of the anti-fingerprint layer 15 may be about 200 nm-400 nm. The anti-fingerprint layer may be formed by magnetron sputtering or directly fluoridating the MgO—$Al_2O_3$ compound layer 13.

Figure 2:
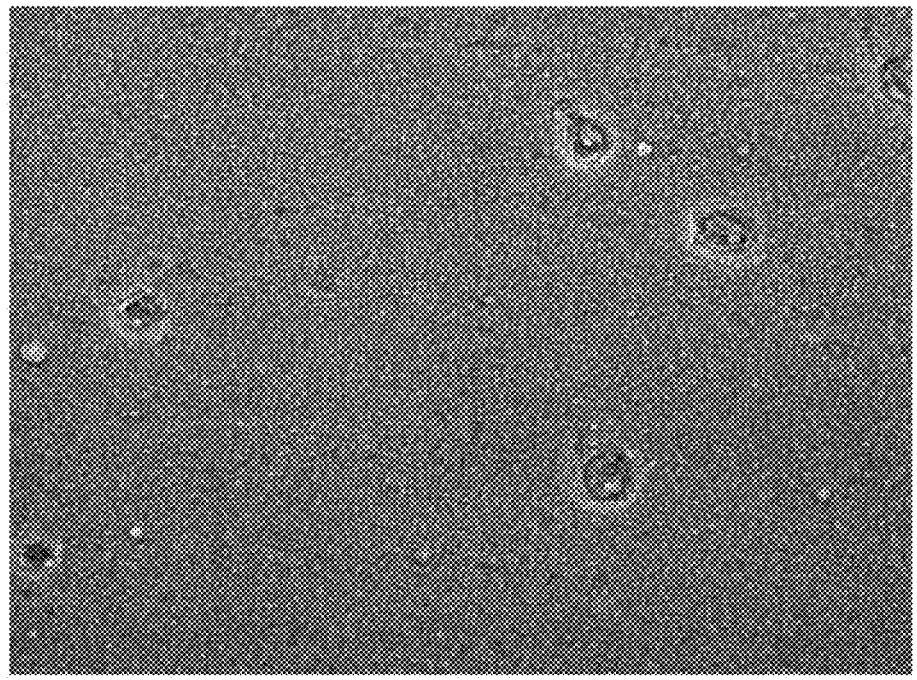
FIG. 2 is a view of the coated article shown in FIG. 1 by a scanning electron microscope (SEM).

FIG. 2 shows a view of the coated article 10 by a scanning electron microscope (SEM), with the anti-fingerprint layer 15 in focus. FIG. 2 shows that the anti-fingerprint layer 15 has an even but nano-dimensioned rough surface. The nano-dimensioned rough surface of the anti-fingerprint layer 15 generate a plurality of nano-dimensioned pores (too small to be shown in FIG. 2). When water or oil droplets are on the surface of the anti-fingerprint layer 15, the nano-dimensioned pores will be sealed by the water or oil droplets and form a plurality of vapor locks. The vapor locks then attract and hold the water or oil droplet in one concentrated location and prevent the water or oil droplet from spreading or distributing across the surface of the anti-fingerprint layer 15. As such, the desired anti-fingerprint property of the anti-fingerprint layer 15 is achieved.

The contact angle between the anti-fingerprint layer 15 and a water-oil droplet has been tested on the coated article 10. The contact angle is defined as the included angle between the surface of the anti-fingerprint layer 15 and the tangent line of the (spherical) water-oil droplet. The test indicates that this contact angle is between 102.5°-117.8°. Thus, the anti-fingerprint layer 15 has a good anti-fingerprint property.

Comparison with the painted anti-fingerprint layer shows that the MgO—$Al_2O_3$ compound layer 13 and the anti-fingerprint layer 15 are tightly bonded to the substrate 11, and provide the coated article 10 with a good abrasion resistance.

A magnesium-aluminum alloy transition layer may be set between the substrate 11 and the MgO—$Al_2O_3$ compound layer 13 to enhance the bonding of the MgO—$Al_2O_3$ compound layer 13 and the anti-fingerprint layer 13 to the substrate 11.

A method for making the coated article 10 may include the following steps:

The substrate 11 is pre-treated, such pre-treating may include the following steps:

The substrate 11 is ultrasonic cleaned.

Figure 3:
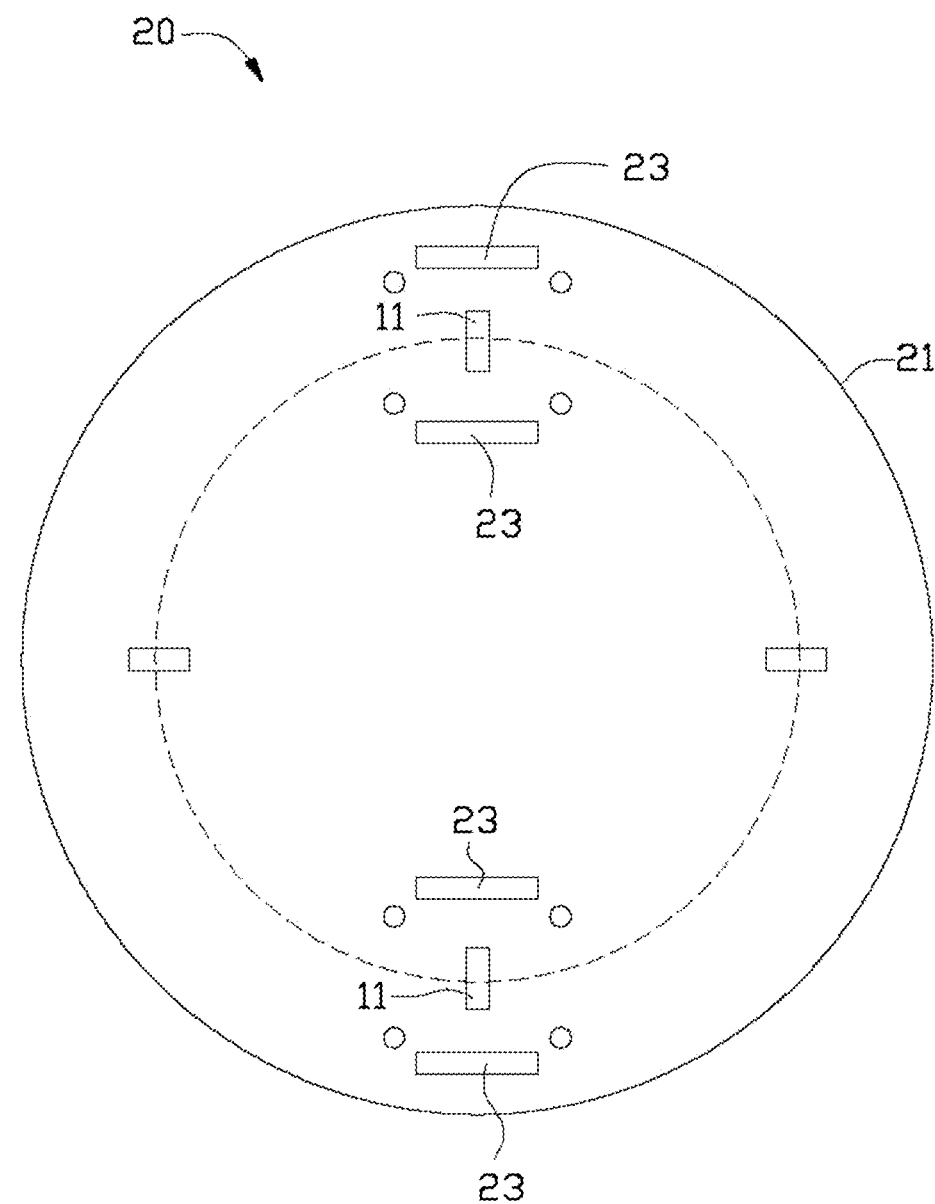
FIG. 3 is an overlook view of an exemplary embodiment of a vacuum sputtering device.

The substrate 11 is plasma cleaned. Referring to FIG. 3, the substrate 11 may be positioned in a coating chamber 21 of a vacuum sputtering device 20. The coating chamber 21 is fixed with magnesium-aluminum alloy targets 23 therein. The magnesium within the target 23 may have a mass percentage of about 10%-20%. The coating chamber 21 is then evacuated to about $4.0 \times 10^{-3}$ Pa. Argon gas having a purity of about 99.999% may be used as a working gas and is injected into the coating chamber 21 at a flow rate of about 300 standard-state cubic centimeters per minute (sccm) to 500 sccm. The substrate 11 may be biased with a bias voltage of about −300 V to about −500 V, then high-frequency voltage is produced in the coating chamber 21 and the argon gas is ionized to plasma. The plasma then strikes the surface of the substrate 11 to clean the surface of the substrate 11. Plasma cleaning the substrate 11 may take about 5 minutes (min) to 10 min. The plasma cleaning process enhances the bond between the substrate 11 and the MgO—$Al_2O_3$ compound layer 13. The magnesium-aluminum alloy targets 23 are unaffected by the pre-cleaning process.

The MgO—$Al_2O_3$ compound layer 13 may be magnetron sputtered on the pretreated substrate 11 by using power at an intermediate frequency for the magnesium-aluminum alloy targets 23. Magnetron sputtering of the MgO—$Al_2O_3$ compound layer 13 is implemented in the coating chamber 21. The inside of the coating chamber 21 is heated to about 150° C.-240° C. Oxygen ($O_2$) may be used as a reaction gas and is injected into the coating chamber 21 at a flow rate of about 60 sccm-200 sccm, and argon gas may be used as a working gas and is injected into the coating chamber 21 at a flow rate of about 300 sccm-500 sccm. Power at an intermediate frequency and at a level of about 5 kilowatt (KW)-10 KW is then applied to the magnesium-aluminum alloy targets 23, so the $O_2$ is ionized and chemically reacts with magnesium and aluminum atoms which are sputtered off from the magnesium-aluminum alloy targets 23 to deposit the MgO—$Al_2O_3$ compound layer 13 on the substrate 11. During the depositing process, the substrate 11 may be biased with a bias voltage. The bias voltage may be about –50 V to about –300 V. Depositing of the MgO—$Al_2O_3$ compound layer 13 may take about 20 min-60 min.

The anti-fingerprint layer 15 may be magnetron sputtered on the MgO—$Al_2O_3$ compound layer 13 by using power at radio frequencies for the magnesium-aluminum alloy targets 23. Magnetron sputtering of the anti-fingerprint layer 15 is implemented in the coating chamber 21. The inside of the coating chamber 21 is maintained at a temperature of about 150° C.-240° C. Oxygen ($O_2$) and carbon tetrafluoride ($CF_4$) may be used as reaction gases and are injected into the coating chamber 21. The $O_2$ has a flow rate of about 15 sccm-40 sccm. The $CF_4$ has a flow rate of about 10 sccm-100 sccm. Argon gas may be used as a working gas and is injected into the coating chamber 21 at a flow rate of about 300 sccm-500 sccm. The power at radio frequencies is then applied to the magnesium-aluminum alloy targets 23 at a power density of between 50 watts per square centimeter (W/cm$^2$) and 100 W/cm$^2$, so the $O_2$ and $CF_4$ are ionized to 'O' and 'F' and chemically react with the magnesium and aluminum atoms which are sputtered off from the magnesium-aluminum alloy targets 23 to deposit a layer of $MgAlO_xF_y$ on the MgO—$Al_2O_3$ compound layer 13 and form the anti-fingerprint layer 15. During the depositing process, the substrate 11 may be biased with a bias voltage of –50 V to about –300 V. The creation of an anti-fingerprint layer 15 may take about 60 min-120 min.

In the exemplary embodiment, the anti-fingerprint layer 15 is imposed after the MgO—$Al_2O_3$ compound layer 13 has been formed, which prevents erosion of the substrate 11 by the ionized $CF_4$ during the laying of the anti-fingerprint layer 15.

The anti-fingerprint layer 15 can also be formed by directly fluoridating the MgO—$Al_2O_3$ compound layer 13.

It is to be understood that before forming the MgO—$Al_2O_3$ compound layer 13, a magnesium-aluminum alloy transition layer may be formed on the substrate 11.

Specific examples of making the coated article 10 are described as following. The ultrasonic cleaning in these specific examples may be substantially the same as described above so is not described here again. Additionally, the process of magnetron sputtering the MgO—$Al_2O_3$ compound layer 13 and the anti-fingerprint layer 15 in the specific examples is substantially the same as described above, and the specific examples mainly emphasize the different process parameters which are available in making the coated article 10.

Example 1

Plasma cleaning the substrate 11: the flow rate of Ar is 500 sccm; the substrate 11 has a bias voltage of –200 V; plasma cleaning of the substrate 11 takes 8 min.

Sputtering to form the MgO—$Al_2O_3$ compound layer 13 on the substrate 11: the flow rate of Ar is 330 sccm, the flow rate of $O_2$ is 200 sccm; the substrate 11 has a bias voltage of –175 V; the magnesium-aluminum alloy targets 23 are subjected to 6 KW of power at an intermediate frequency, the temperature inside the coating chamber 21 is 150° C.; the sputtering of the MgO—$Al_2O_3$ compound layer 13 takes 40 min, and the MgO—$Al_2O_3$ compound layer 13 has a thickness of 600 nm.

The sputtering process to form a $MgAlO_xF_y$ layer in forming an anti-fingerprint layer 15 on the MgO—$Al_2O_3$ compound layer 13: the flow rate of Ar is 330 sccm, the flow rate of $O_2$ is 20 sccm; the flow rate of $CF_4$ is 70 sccm; the substrate 11 has a bias voltage of –175 V; the magnesium-aluminum alloy targets 23 are subjected to radio frequency power at a power density of 80 W/cm$^2$; the temperature inside the coating chamber 21 is 150° C.; the sputtering of the anti-fingerprint layer 15 takes 40 min; the value of 'x' within the $MgAlO_xF_y$ is '1', the value of 'y' within the $MgAlO_xF_y$ is '3', and the thickness of the anti-fingerprint layer 15 is 360 nm.

The contact angle between the anti-fingerprint layer 15 and any water-oil droplet is 117.8°.

Example 2

Plasma cleaning the substrate 11: the flow rate of Ar is 500 sccm; the substrate 11 has a bias voltage of –200 V; the plasma cleaning of the substrate 11 takes 9 min.

The sputtering process to form the MgO—$Al_2O_3$ compound layer 13 on the substrate 11: the flow rate of Ar is 460 sccm, the flow rate of $O_2$ is 170 sccm; the substrate 11 has a bias voltage of –60 V; the magnesium-aluminum alloy targets 23 are subjected to 8 KW of power at an intermediate frequency, the temperature inside the coating chamber 21 is 220° C., and the sputtering of the MgO—$Al_2O_3$ compound layer 13 takes 40 min; the MgO—$Al_2O_3$ compound layer 13 has a thickness of 530 nm.

The sputtering process to form an $MgAlO_xF_y$ layer in creating an anti-fingerprint layer 15 on the MgO—$Al_2O_3$ compound layer 13: the flow rate of Ar is 460 sccm, the flow rate of $O_2$ is 40 sccm; the flow rate of $CF_4$ is 42 sccm; the substrate 11 has a bias voltage of –60 V; the magnesium-aluminum alloy targets 23 are subjected to radio frequency power at a power density of 75 W/cm$^2$; the temperature inside the coating chamber 21 is 220° C.; the sputtering of the anti-fingerprint layer 15 takes 40 min; the value of 'x' within the $MgAlO_xF_y$ is '2', the value of 'y' within the $MgAlO_xF_y$ is '1', and the thickness of the anti-fingerprint layer 15 is 220 nm.

The contact angle between the anti-fingerprint layer 15 and any water-oil droplet is 102.5°.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A coated article, comprising:
   a substrate;
   a magnesium oxide-alumina compound layer formed on the substrate; and
   an anti-fingerprint layer directly formed on and contacting the magnesium oxide-alumina compound layer, the anti-fingerprint layer being a magnesium-aluminum-oxygen-fluorine layer, the magnesium-aluminum-oxygen-fluorine having a chemical formula of $MgAlO_xF_y$, with $0<x<2.5$, $0<y<5$.

2. The coated article as claimed in claim 1, wherein the magnesium oxide-alumina compound layer has a non-crystalline structure.

3. The coated article as claimed in claim 1, wherein the magnesium oxide-alumina compound layer has a thickness of about 500 nm-600 nm.

4. The coated article as claimed in claim 1, wherein the anti-fingerprint layer has a non-crystalline structure.

5. The coated article as claimed in claim 4, wherein the anti-fingerprint layer has a nano-dimensioned rough surface.

6. The coated article as claimed in claim 4, wherein the anti-fingerprint layer has a thickness of about 200 nm-400 nm.

7. The coated article as claimed in claim 1, wherein the anti-fingerprint layer is formed by magnetron sputtering or fluoridating the magnesium oxide-alumina compound layer.

8. The coated article as claimed in claim 1, wherein the substrate is made of metal material selected from a group consisting of stainless steel, aluminum, aluminum alloy, copper, copper alloy, and zinc; or the substrate is made of ceramic or glass.

9. The coated article as claimed in claim 1, wherein the anti-fingerprint layer has a contact angle of about 102.5°-117.8° with water-oil droplets.

10. The coated article as claimed in claim 1, further comprising a magnesium-aluminum alloy transition layer formed between the substrate and the magnesium oxide-alumina compound layer.

* * * * *